(12) United States Patent
Joshi

(10) Patent No.: US 7,274,590 B2
(45) Date of Patent: Sep. 25, 2007

(54) RANDOM ACCESS MEMORY WITH STABILITY ENHANCEMENT AND EARLY READ ELIMINATION

(75) Inventor: Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/483,117

(22) Filed: Jul. 6, 2006

(65) Prior Publication Data

US 2006/0250860 A1      Nov. 9, 2006

Related U.S. Application Data

(63) Continuation of application No. 10/985,453, filed on Nov. 10, 2004, now Pat. No. 7,193,904.

(51) Int. Cl.
*G11C 11/00* (2006.01)
(52) U.S. Cl. ............... 365/154; 365/189.08; 365/156; 365/189.01; 365/194
(58) Field of Classification Search .......... 365/189.08, 365/189.01, 154, 156, 194
See application file for complete search history.

(56) References Cited

U.S. PATENT DOCUMENTS

| | | | |
|---|---|---|---|
| 4,620,299 A * | 10/1986 | Remington et al. .... | 365/230.06 |
| 4,825,413 A * | 4/1989 | Tran ...................... | 365/189.06 |
| 5,615,168 A * | 3/1997 | Lattimore et al. ......... | 365/233 |
| 5,644,546 A * | 7/1997 | Furumochi et al. ........ | 365/226 |
| 6,212,117 B1 * | 4/2001 | Shin et al. .................. | 365/205 |
| 6,215,713 B1 * | 4/2001 | Austin ....................... | 365/205 |
| 6,323,693 B1 * | 11/2001 | Park ........................... | 327/56 |
| 6,356,485 B1 * | 3/2002 | Proebsting ............. | 365/189.01 |
| 6,393,600 B1 * | 5/2002 | Sribhashyam et al. ......... | 716/1 |
| 6,724,225 B2 * | 4/2004 | Joshi et al. ................ | 326/113 |
| 6,990,038 B1 * | 1/2006 | Chan et al. ............ | 365/230.05 |
| 7,113,433 B2 * | 9/2006 | Chan et al. ................. | 365/190 |

* cited by examiner

*Primary Examiner*—Richard T. Elms
*Assistant Examiner*—Eric Wendler
(74) *Attorney, Agent, or Firm*—Keusey, Tutunjian & Bitetto, P.C.; Anne V. Dougherty, Esq.

(57) ABSTRACT

A random access memory includes a memory cell having an access device. The access device is switched on or off in accordance with a signal on a wordline to conduct a memory operation through the access device. A logic circuit is coupled to the wordline to delay or gate the wordline signal until an enable signal has arrived at the logic circuit. The access device improves stability and eliminates early read problems.

14 Claims, 7 Drawing Sheets

RANDOM ACCESS MEMORY WITH
STABILITY ENHANCEMENT AND EARLY
READ ELIMINATION

RELATED APPLICATION DATA

This is a continuation application of application Ser. No. 10/985,453, filed on Nov. 10, 2004, now U.S. Pat. 7,193,904.

BACKGROUND OF THE INVENTION

1. Field of the Invention

The present invention relates to semiconductor memory, and more particularly to a device and method for eliminating early read problem in static memories.

2. Description of the Related Art

As technology scales, inter-die and intra-die variations in process parameters (e.g., channel length (L), width (W), threshold voltage (Vt), etc.) have become serious problems in circuit design. For example, the device-to-device (intra-die) variations in L, W or Vt between neighboring transistors in a static random access memory (SRAM) cell can significantly degrade not only in stability of the cell but in read and write delays. Thus, the timing of the read, write control signals play a crucial role in determining the functionality of SRAM.

The early read problem occurs when a wordline is turned on before write control signals. This takes place in a "fast cell condition".

Referring to FIG. 1, a schematic diagram of an SRAM memory circuit 10 is shown along with a timing diagram to illustrate an early read condition. A cell 11 includes cross-coupled inverters that are written to and read from using bitlines 14a and 14b and a wordline 16. It is preferable to have bitlines 14a and 14b activated after the wordline. Bitlines 14 are activated in accordance with a write control signal 15 (e.g., active low) and a bit decode signal 17 (e.g., active low). When wordline signal 13 is activated (goes high), if the write control 15 and bit decode 17 signals are out of sync and arrive later than signal 13 as shown in FIG. 1, an early read before write condition 19 occurs on the left bitline 14a. This condition causes synchronization concerns and may result in the loss of data.

SUMMARY OF THE INVENTION

A random access memory includes a memory cell having an access device. The access device is switched on or off in accordance with a signal on a wordline to conduct a memory operation through the access device. A logic circuit is coupled to the wordline to delay or gate the wordline signal until an enable signal has arrived at the logic circuit. The access device improves stability and eliminates early read problems.

A static random access memory includes a bit select circuit having cross-coupled transistors gated by a bit decode signal. Memory cells include two cross-coupled inverters, each including a pair of complementary transistors configured to carry out the memory operations wherein the cross-coupled transistors of the bit select circuit are sized to be larger than one of each pair of complementary transistors to improve performance of memory operations in the memory cells. The bit select circuit may be employed with the logic circuit.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention addresses early read errors in memory devices by providing a logic circuit, which ensures that a wordline is not activated until the appropriate bitline signals are available. This significantly reduces or eliminates the chances of an early read error occurring. Static random access memories (SRAM) will be employed to illustratively describe the present invention. It is to be understood that the present invention is applicable to other memory types such as for example, dynamic random access memories (DRAM), etc.

Figure 2:
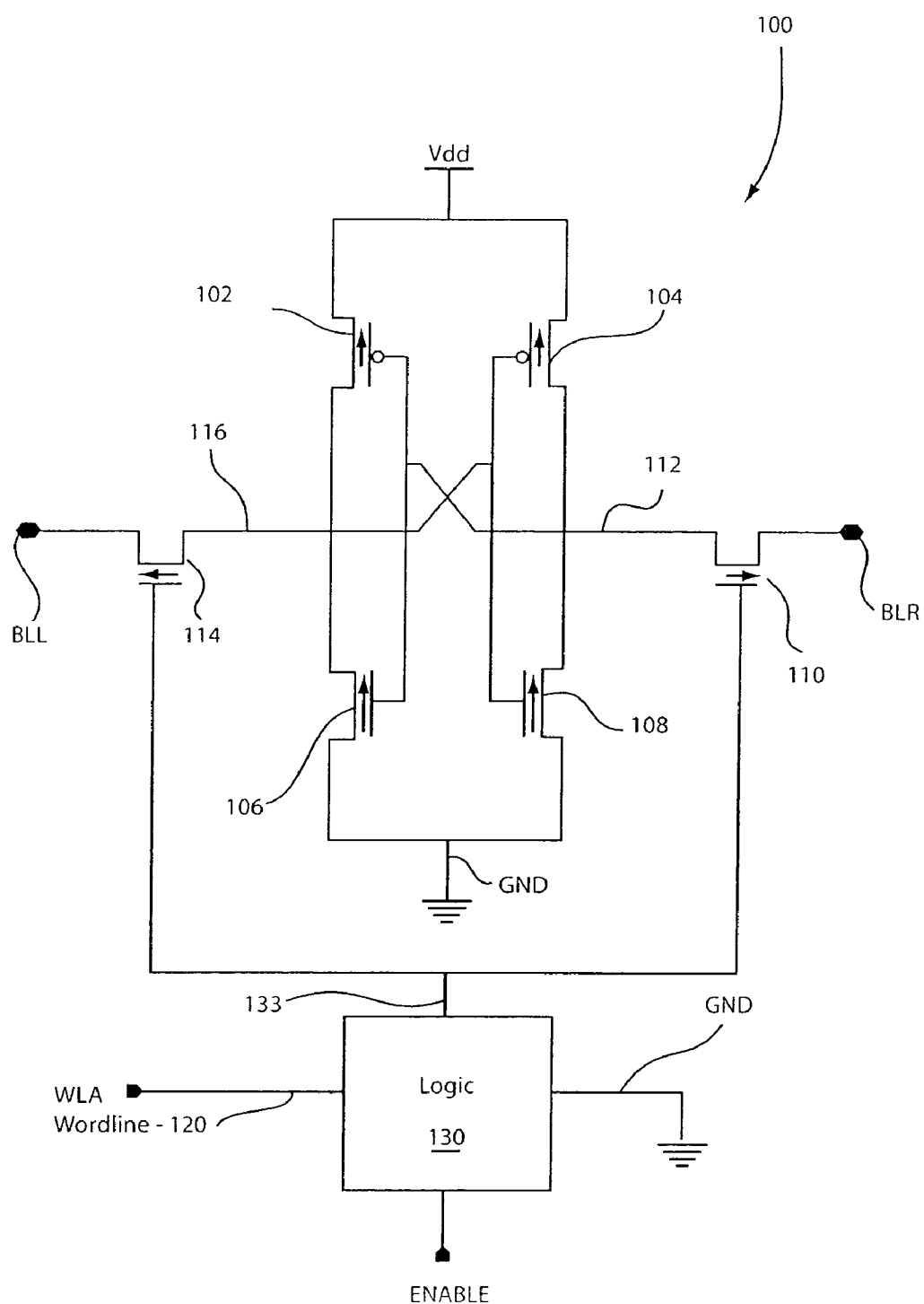
FIG. 2 is a schematic diagram of a memory circuit having a logic circuit in accordance with one embodiment of the present invention.

Referring now in detail to the figures in which like numerals represent the same or similar elements and initially to FIG. 2, a memory circuit 100 is shown in accordance with one embodiment of the present invention. Circuit 100 includes a static random access memory (SRAM) although other memory types may also be employed. Circuit 100 may be employed in high performance applications, e.g., in caches, microprocessors, memory buffers in application specific integrated circuits (ASICs), etc.

Static random access memories (SRAM) include a cell, which may include six transistors (6T SRAM) that store data and can be read from and written to without a refresh cycle. Four transistors 102, 104, 106 and 108 include a combination of PFET (p-doped field effect transistors) and NFET (n-doped field effect transistors) transistors. In the embodiment shown, transistors 102 and 104 are PFETs while transistors 106 and 108 are NFETs. Gates of transistors 102 and 106 are connected, as are gates of transistors 104 and 108. Transistors 102 and 104 provide a supply voltage Vdd under appropriate signal conditions while transistors 106 and 108 provide conduction to ground (GND) under other appropriate conditions.

The gates of transistors 102 and 106 are activated by a transistor 110, which connects a bitline signal BLR (bitline right) from a bitline 112 when transistor 110 is conducting. Likewise, the gates of transistors 104 and 108 are activated by a transistor 114, which connects a bitline signal BLL (bitline left) from a bitline 116 when transistor 114 is conducting. Gates of transistors 114 and 110 are activated/deactivated in accordance with a wordline signal (WLA) from a wordline 120.

In accordance with on aspect of the present invention, a logic circuit 130 is provided. Circuit 130 is coupled to wordline 120 and prevents a wordline signal (WLA) from activating transistors 114 and/or 110 to initiate a read or write access.

In one embodiment, wordline signal WLA is coupled to transistors 114 and 110 in accordance with an ENABLE signal (e.g., BITSELECT or BIT DECODE). Unless and until ENABLE (BITSELECT) enables a connection of wordline 120, transistors 114 and 110 are non-conducting and do not permit bitline signals from being connected to transistors 102-108. BITSELECT ensures that the bitline signals are available and arrive at the same time or before the wordline signal WLA. In this way, early read problems are significantly reduced or eliminated.

In one embodiment, circuit 130 includes a connection to ground (GND). BITSELECT enables grounding of the gates of transistors 114 and 110 (through connection 133) when wordline 120 is disconnected from these gates. BITSELECT may be generated in a plurality of different ways. For example, BITSELECT may be generated by a synchronizing clock signal, which may be derived from the system's operational clock or a more local clock or may be derived from any other synchronizing signal that assures bitline signals as controlled by, say, write control and bit decode signals, arrive at a same time or after wordline 120 is activated by WLA. BITSELECT may include or be derived from a bitline decode signal.

Circuit 100 may be included in an array region of memory cells. As such, BITSELECT may be provided to multiple cells simultaneously. In addition, circuit 130 may service multiple cells simultaneously as well.

Figure 3:
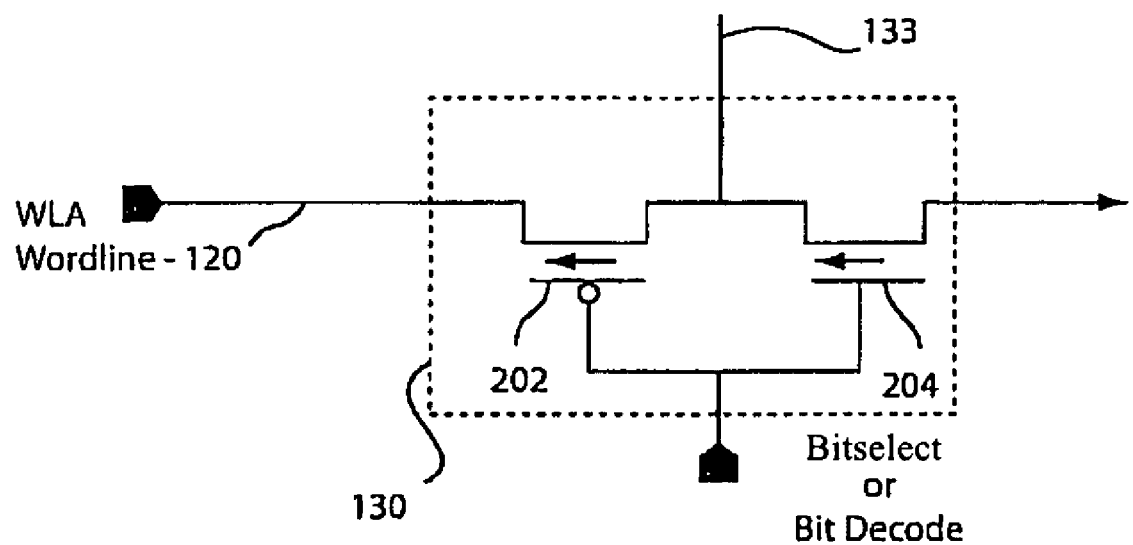
FIG. 3 is a schematic diagram of a logic circuit in accordance with another embodiment of the present invention.

Referring to FIG. 3, an illustrative logic circuit 130 is shown in accordance with one exemplary embodiment of the present invention. Logic circuit 130 includes two transistors: a PFET 202 and an NFET 204. In accordance with a BITSELECT signal, a wordline 120 is connected to a connection 133 by transistor 202. When transistor 202 is deactivated by BITSELECT, transistor 204 is conducting and drains any residual charge in connection 133 (and gates of transistors 114 and 110 in FIG. 2) to ground (GND) in the same clock cycle. This avoids any floating nodes.

The addition of transistors 202 and 204 does not significantly increase layout area of the cell. For example, the cell only needs one small track of space in a metal layer (e.g., M2) and may thereby still support all the needs for an SRAM cell. In addition, the cell topology may shut off the wordline 120 for half of selected cells as a BITSELECT (bit decode) signal is high for unselected columns. Thus, stability is increased significantly. Stability is described in greater detail with reference to FIGS. 7 and 8.

Figure 4:
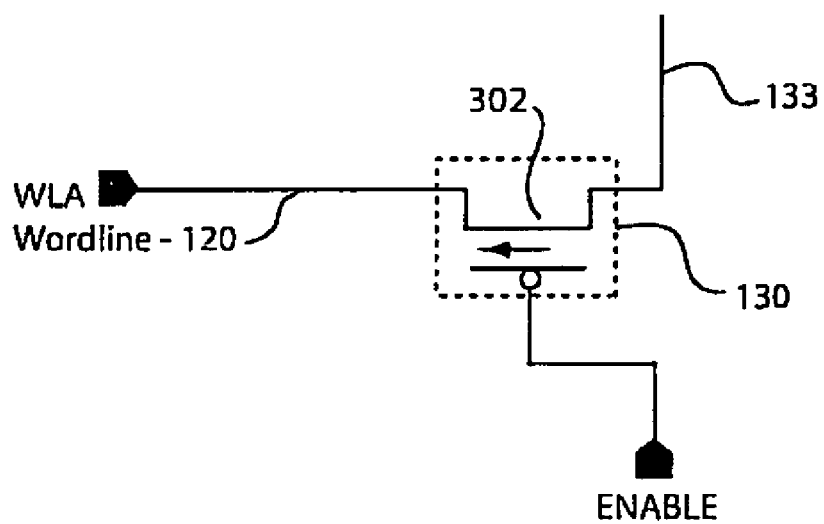
FIG. 4 is a schematic diagram of a logic circuit in accordance with yet another embodiment of the present invention.

Referring to FIG. 4, an alternate embodiment is shown for logic circuit 130. Circuit 130 may include a single transistor 302 (PFET or NFET). Transistor 302 connects connection 133 to wordline 120 when appropriate to trigger the cell.

However, when WLA is low, transistor 302 may be pulsed down to zero to drain any residual charge as described above. This may be performed by using pulses of Enable signals, for example. The Enable signal may include BITSELECT, BIT DECODE (True or Complement) or other signals. Transistor 302 (PFET or NFET) may include a low or zero threshold voltage device.

Logic circuit 130 and cell 100 have been shown with transistors of a given polarity and location. It is to be understood that these transistors may be interchanged with transistors of opposite doping (NFET for PFET) and the appropriately controlling signals voltages adjusted for proper functioning. In addition, greater or fewer components and their locations may also be changed in accordance with the present invention. Various combinations of transistors are possible (e.g., instead of a low threshold voltage (Vt) NFET connected to the complement of BITSELECT, a PFET may be connected to BITSELECT and vice versa).

Figure 5:
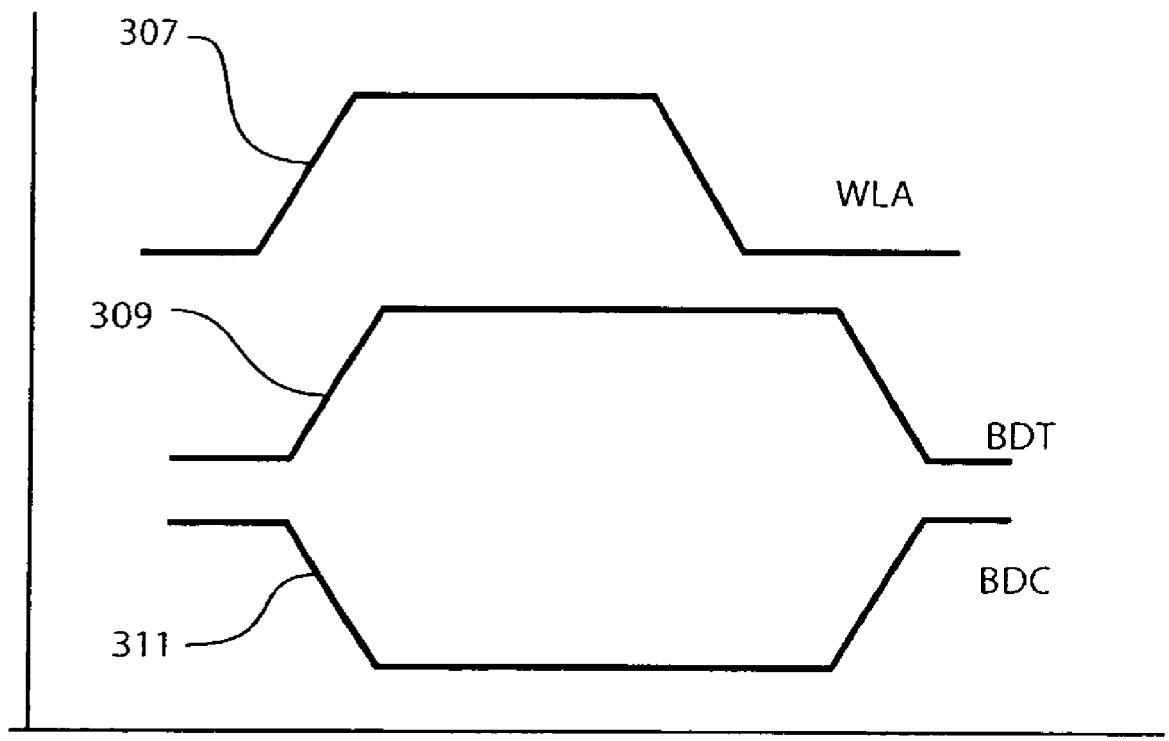
FIG. 5 is a timing diagram showing waveforms for comparing wordline active signals to bit decode true (BDT) and bit decode complement (BDC) signals in accordance with the present invention.

In alternate embodiments, transistor 302 may include an NFET and instead of BITSELECT enabling the gate of the NFET 302, BIT DECODE (True) (BDT) may be employed to enable the NFET 302. NFET 302 is preferably a zero, low or small threshold voltage device to reduce delay and avoid a threshold voltage drop. FIG. 5 shows a timing diagram for wordline active (WLA) and for BDT.

If transistor 302 is embodied as a PFET, than BIT DECODE (complement) or BDC may be employed instead of BDT. In this case, BIT DECODE (complement) (BDC) may be employed to enable the PFET 302. PFET 302 is preferably a zero, low or small threshold voltage device to reduce delay and avoid a threshold voltage drop.

FIG. 5 indicates a timing diagram for a wordline active signal WLA 307, BDT 309 and BDC 311. It should be noted that the pulse width of BDC 311 and BDT 309 are preferably larger than that of WLA 307. This creates a better pull-up/pull-down of the passgate (e.g., transistors 110 and 114 in FIG. 2).

Figure 1:
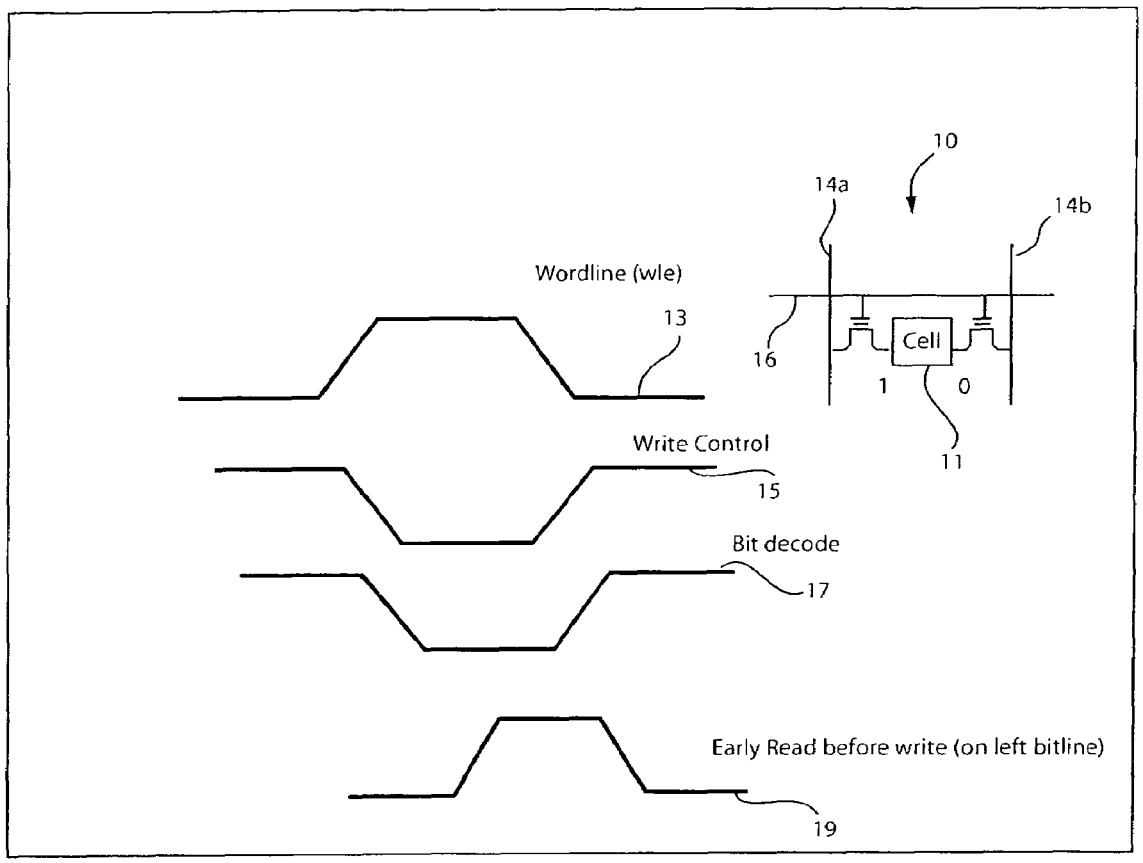
FIG. 1 is a timing diagram showing waveforms of a conventional SRAM where an early read condition occurs.
Figure 6:
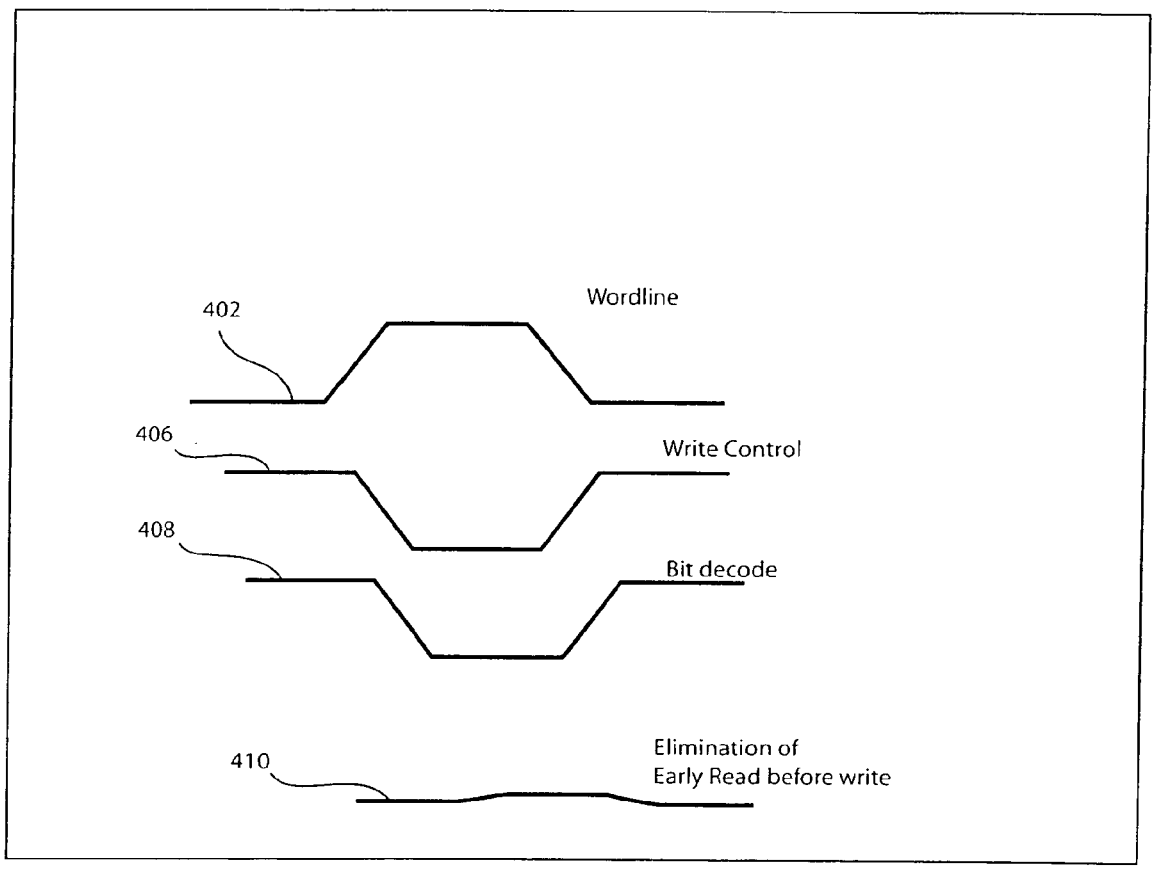
FIG. 6 is a timing diagram showing waveforms of an SRAM where an early read condition has been eliminated in accordance with the present invention.

Referring to FIG. 6, an embodiment of the present invention was simulated to determine the status of early read errors. Waveforms for wordline 402, write control 404 and bit decode 406 show the same synchronization problem outlined with respect to FIG. 1. However, as a result of the present invention the "early read mode" is eliminated as shown be waveform 410 by employing the topology and design of the present invention.

Figure 7:
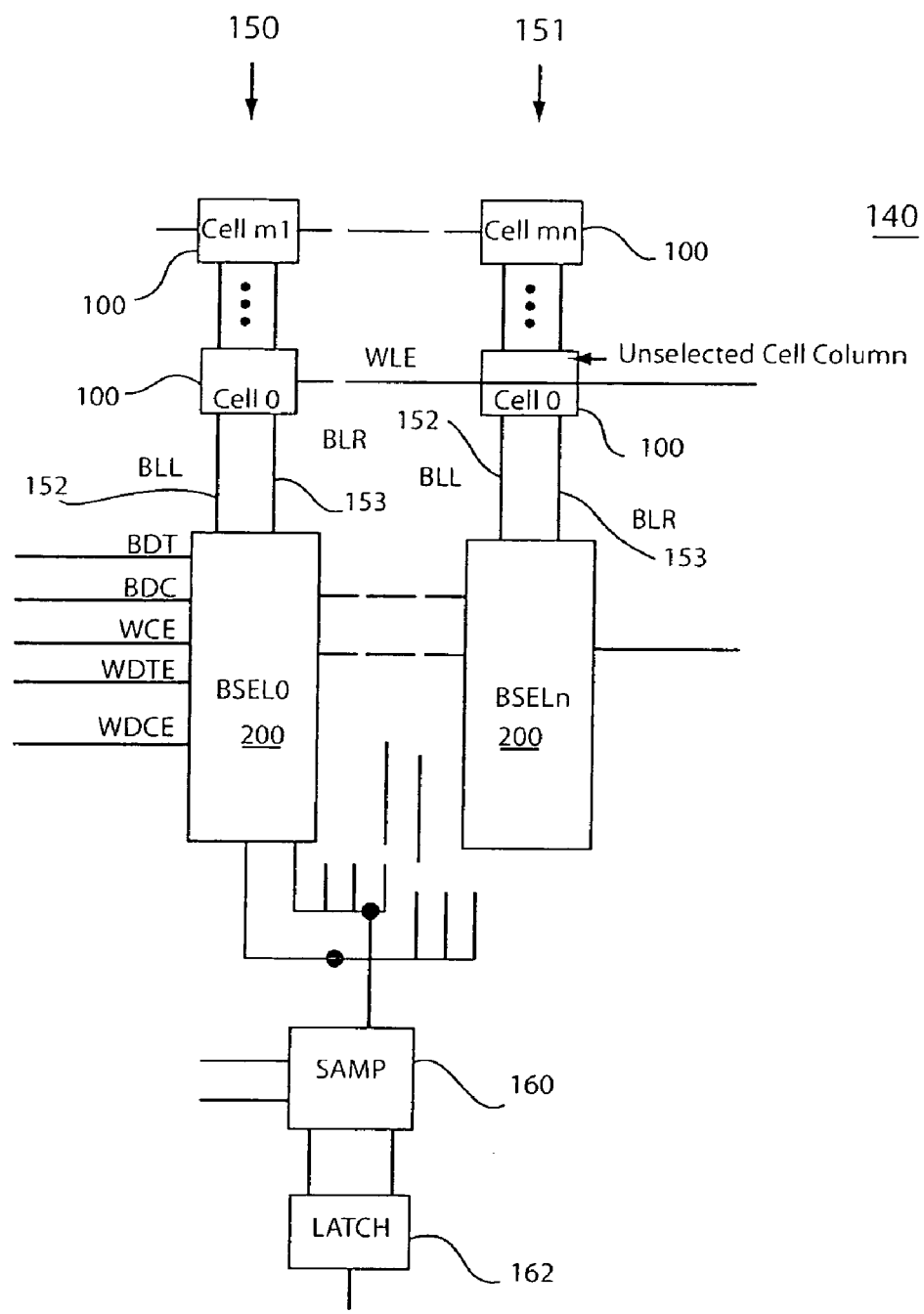
FIG. 7 is a schematic block diagram showing a portion of the circuitry for a random access memory in accordance with the present invention.

Referring to FIG. 7, an illustrative region of an SRAM device 140 is shown to illustrate features and advantages of embodiments of the present invention. A plurality of SRAM cells 100 are included with logic circuitry 130 (FIG. 2). During operations, a column 150 is selected and a column 151 is not selected (unselected cell column). When a wordline (WLE) is on, the unselected column in a conventional SRAM device (6-T) cell becomes "half selected" as a result of the conventional wiring structure. Due to leakage from, e.g., the bitlines (BLL and BLR) 152 and 153, improperly toleranced cells and/or threshold voltage mismatches due to size and dopant difference in the devices in the conventional SRAM, cells can flip causing them to dump stored data or otherwise malfunction. Threshold voltage mismatches of cross-coupled devices due to, e.g., length and width variations and dopant fluctuations can especially cause flipping of the cells in the "half select mode".

In accordance with the present invention, the columns 150 and 151 are gated with the wordline WLE by employing logic circuit 130 (FIG. 2). In this way, the pass gate of the cell 100 only turns on when the column select is "on". Otherwise, the cells are shut-off (or get unselected). This helps to prevent any current from bitlines from leaking into the cell and thereby prevents flipping the cell. Therefore, stability of the cell is greatly improved.

Each column of SRAM 140 may include a bitselect circuit 200 which rely on signal inputs, e.g., bit decode true (BDT), bit decode complement (BDC) write control enable (WCE), write data true enable (WDTE), (write data complement enable (WDCE). These inputs activate an appropriate bitline and determine whether read or write operations are carried out and what data should be written to a particular bitline or cell. Bitselect circuits 200 connect to sense amplifiers (SAMP) 160 and latches 162 as is known in the art. However, in accordance with embodiments of the present invention (see e.g., FIG. 8), sense amplifiers 160 can be eliminated.

Figure 8:
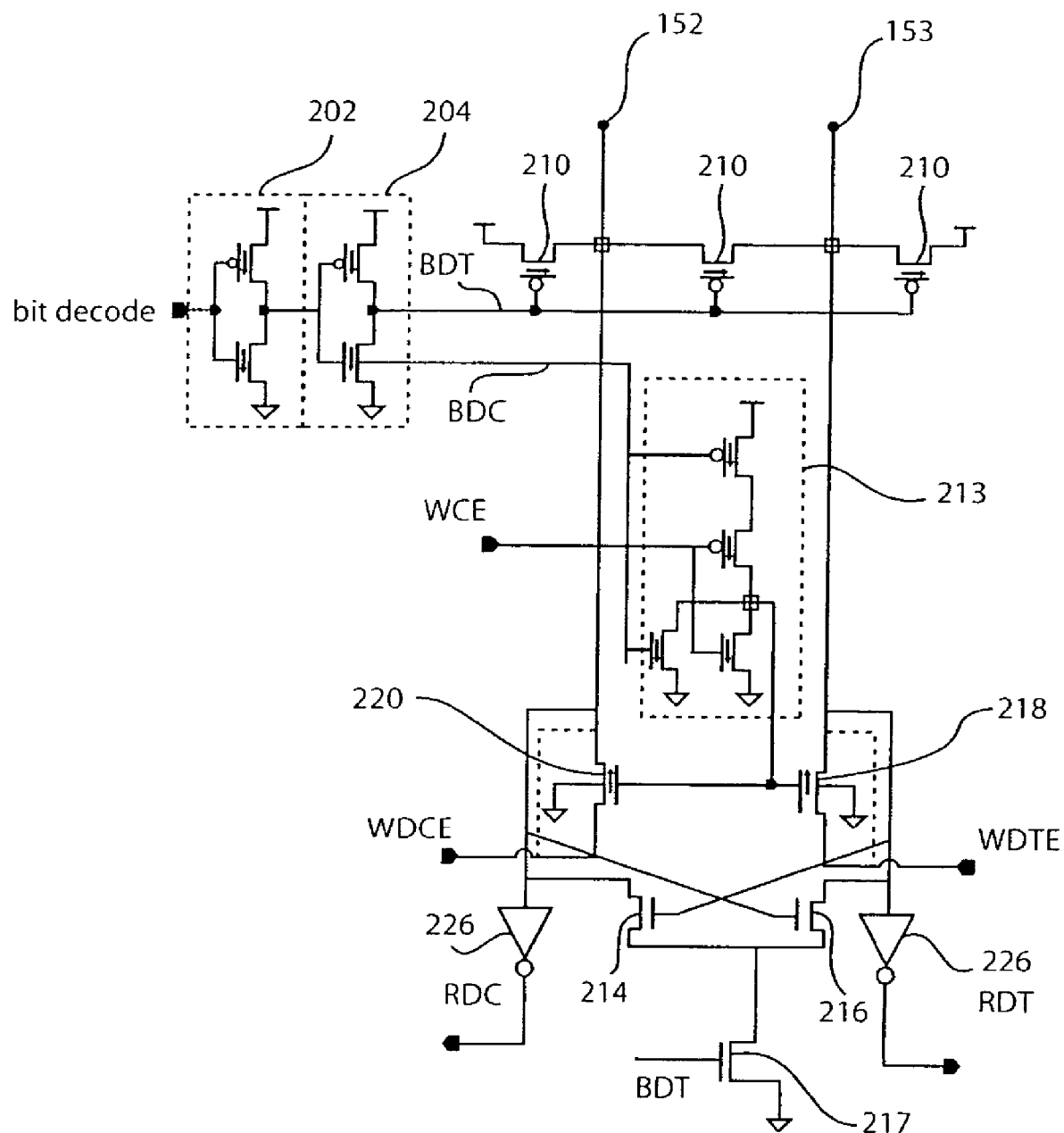
FIG. 8 is a schematic diagram showing a bit select circuit for improving read and write performance of memory cells for the random access memory of FIG. 7 in accordance one embodiment of the present invention.

Referring to FIG. 8, a bit select circuit 200 is illustratively shown, which may be employed with cell with logic circuitry 130 in the circuits described above or independently therefrom. Circuit 200 includes inverters 202 and 204, which are employed to generate BDT and BDC signals from a bit decode signal. The BDT signal is employed to appropriately charge, discharge or equalize bitlines 152 and 153 by switching transistors 210 on or off. BDC is employed along with a write control enable signal (WRITE CONTROL or WCE) to enable a write operation of an SRAM cell 100 (FIG. 7) using circuit 213.

Using bit select circuit 200, the performances of the cells 100 are improved in the ability of the circuit to both read and write. Sizes of transistors 214 and 216 are selected to optimize read performance. In one embodiment, transistors 214 and 216 may be between about a 1.5 times to about 4 times the size of transistors 106 and 108 of cell 100 (FIG. 2). These size ratios may be adjusted to optimize performance under specific conditions or applications. Transistor 217 is preferably about the same size as transistor 214 or 216.

Transistors 214 and 216 are cross-coupled transistors, e.g., NFETS, gated by a transistor 217 responsive to BDT, for example. Bit select circuit 200 can improve the read performance using transistors 214 and 216, e.g., making them larger. When the BDT signal is high the data during read "1" on the right side would turn on the bottom right transistors 216 and 218 so that the right bitline 153 is pulled down fast to improve the read performance while a larger passgate (e.g., transistors 110 and 114) in the cell 100 assists in increasing write performance. Transistors 220 and 214 would perform similarly for the left bitline 152.

Output drivers 226 may be included to amplify signals such that the sense amplifier (see sense amplifier 160 in FIG. 7) may be eliminated. Drivers (inverters) 226 may be skewed with respect to PFET to NFET ratio, e.g., the PFET may be much larger than the NFET for each driver 226.

WDTE, WDTE and read data complement (RDC) and read data true (RDT) provide appropriate signaling for the bitselect circuit 200 as is known in the art.

Having described preferred embodiments for eliminating early read and increasing stability in random access memory (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A random access memory, comprising:
a memory cell including at least one access device, the at least one access device being switched on or off in accordance with a signal on a wordline to conduct a memory operation through the at least one access device, the at least one access device configured to gate a bitline signal; and
a logic circuit coupled to the wordline to receive and gate the wordline signal in accordance with an enable signal at the logic circuit, wherein the enable signal ensures that an arrival of the bitline signal at the at least one access device occurs at or before the arrival of the signal on the wordline.

2. The memory as recited in claim 1, wherein the memory cell includes a static random access memory cell.

3. The memory as recited in claim 1, wherein the at least one access device includes a bitline transistor.

4. The memory as recited in claim 1, wherein the logic circuit includes a transistor which selectively couples the wordline to a gate of the at least one access device.

5. The memory as recited in claim 1, wherein the enable signal is timed by a system clock signal.

6. The memory as recited in claim 1, further comprising a bit select circuit having cross-coupled transistors gated by a bit decode signal, wherein the cross-coupled transistors are sized to improve performance of memory operations.

7. The memory as recited in claim 1, wherein the enable signal includes a bit select signal.

8. The memory as recited in claim 4, wherein the selective coupling of the transistor to the wordline is controlled by the enable signal which includes a bit decode signal.

9. A static random access memory, comprising:
a memory cell including first and second access transistors respectively coupled to first and second bitlines, the first and second access transistors having gates coupled to a connection node; and
a logic circuit coupled to a wordline, the logic circuit selectively coupling the wordline to the connection node in accordance with an enable signal, wherein the enable signal provides for an arrival of the bitline signal at or before a trigger signal of the wordline such that the trigger signal on the wordline is synchronized with bit line signals to ensure an arrival of the bit line signals at or before the trigger signal to reduce or eliminate an early read condition.

10. The memory as recited in claim 9, wherein the logic circuit includes a transistor, which selectively couples the wordline to the connection node.

11. The memory as recited in claim 9, further comprising a bit select circuit having cross-coupled transistors gated by a bit decode signal, wherein the cross-coupled transistors are sized to improve performance of memory operations.

12. The memory as recited in claim 9, wherein the enable signal includes a bit select signal.

13. The memory as recited in claim 10, wherein the selectively coupling of the connection node to die wordline is controlled by an enable signal, which includes a bit decode signal.

14. The memory as recited in claim 13, wherein the enable signal is timed by a system clock signal.

* * * * *